(12) United States Patent
Nowling et al.

(10) Patent No.: US 9,418,865 B2
(45) Date of Patent: Aug. 16, 2016

(54) WET ETCHING OF SILICON CONTAINING ANTIREFLECTIVE COATINGS

(71) Applicants: Intermolecular Inc., San Jose, CA (US); International Business Machines Corporation, Armonk, NY (US)

(72) Inventors: Gregory Nowling, San Jose, CA (US); John Fitzsimmons, Poughkeepsie, NY (US)

(73) Assignees: Intermolecular, Inc., San Jose, CA (US); International Business Machines Corporation, Armonk, NY (US)

( * ) Notice: Subject to any disclaimer, the term of this patent is extended or adjusted under 35 U.S.C. 154(b) by 58 days.

(21) Appl. No.: 14/140,737

(22) Filed: Dec. 26, 2013

(65) Prior Publication Data

US 2015/0187596 A1    Jul. 2, 2015

(51) Int. Cl.
*H01L 21/311*    (2006.01)

(52) U.S. Cl.
CPC ............................. *H01L 21/31111* (2013.01)

(58) Field of Classification Search
CPC ................... H01L 23/538; H01L 21/02019
See application file for complete search history.

(56) References Cited

U.S. PATENT DOCUMENTS

| | | | |
|---|---|---|---|
| 5,518,966 A | 5/1996 | Woo | |
| 6,004,850 A | 12/1999 | Lucas | |
| 6,017,816 A | 1/2000 | Ni | |
| 6,569,784 B1* | 5/2003 | Wang | H01L 21/82384 257/E21.637 |
| 2002/0058371 A1* | 5/2002 | Ohuchi | H01L 21/32051 438/200 |
| 2002/0127859 A1* | 9/2002 | Wu | H01L 21/02032 438/689 |
| 2003/0054611 A1* | 3/2003 | Kanaya | H01L 27/115 438/266 |

(Continued)

FOREIGN PATENT DOCUMENTS

WO    WO-2011-041268 A1    4/2011

OTHER PUBLICATIONS

White, R., et al.; Isotropic Silicon Etching Using HFNitricAcetic Acid HNA; Jun. 6, 2007; Tufts University; Journal of the Electrochemical Society pp. 1903 1909.

(Continued)

*Primary Examiner* — Mohammad Choudhry (57) ABSTRACT

Provided are methods for processing semiconductor substrates or, more specifically, etching silicon containing antireflective coatings (SiARCs) from the substrates while preserving silicon oxides layers disposed on the same substrates. An etching solution including sulfuric acid and hydrofluoric acid may be used for these purposes. In some embodiments, the weight ratio of sulfuric acid to hydrofluoric acid in the etching solution is between about 15:1 and 100:1 (e.g., about 60:1). The temperature of the etching solution may be between about 30° C. and 50° C. (e.g., about 40° C., during etching). It has been found that such processing conditions provide a SiARC etching rate of at least about 50 nanometers per minute and selectivity of SiARC over silicon oxide of greater than about 10:1 or even greater than about 50:1. The same etching solution may be also used to remove photoresist, organic dielectric, and titanium nitride.

17 Claims, 3 Drawing Sheets

(56) References Cited

U.S. PATENT DOCUMENTS

| | | | | |
|---|---|---|---|---|
| 2005/0230045 A1* | 10/2005 | Okuchi | ............ | H01L 21/31111 156/345.18 |
| 2007/0042567 A1* | 2/2007 | Koyata | .............. | H01L 21/02019 438/459 |
| 2008/0096392 A1* | 4/2008 | Kakuda | ................ | H01J 37/321 438/714 |
| 2009/0137126 A1* | 5/2009 | Kim | ................ | H01L 21/30617 438/703 |
| 2009/0203176 A1* | 8/2009 | Kakehata | .......... | H01L 21/76254 438/164 |
| 2012/0172263 A1* | 7/2012 | Reyes | ................... | G01N 15/00 507/205 |
| 2012/0231554 A1 | 9/2012 | Akinmade Yusuff | | |
| 2013/0270625 A1* | 10/2013 | Jang | .................... | H01L 29/7926 257/324 |
| 2013/0341197 A1* | 12/2013 | Piascik | ................... | C25D 5/12 205/176 |

OTHER PUBLICATIONS

Scott Clark; Silicon Nitride etch; Jan. 1, 1998; Bold Technologies, Inc.; MSCE.

www.microchemicals.eu; Etching with Hydrofluoric Acid; ; www.microchemicals.eu.

Knotter et al.; Performing selective etch of SiN4 and SiO2 using a singlewafer wetetch technology; ; Micro Magazine.com.

* cited by examiner

WET ETCHING OF SILICON CONTAINING ANTIREFLECTIVE COATINGS

BACKGROUND

Photolithographic processes often involve deposition of anti-reflection coatings (ARCs) to reduce reflection of light from other layers disposed underneath the photoresist. For example, the ARC layer may prevent a standing wave effect caused by interference between incident light toward the photoresist layer and reflected light from the layer to be etched. Various organic and inorganic ARC layers have been developed in efforts to reduce the size of features and to increase their density. Silicon-containing anti-reflection coatings (SiARCs) are promising candidates for various applications, such as applications involving hard masks, because the silicon content of such coatings can be specifically tuned to provide various optical properties. However, removal of SiARCs, especially SiARCs with high silicon content, is difficult, and new processing methods for removing these materials and other layers are needed in semiconductor processing.

SUMMARY

Provided are methods for processing semiconductor substrates or, more specifically, for etching SiARCs while preserving silicon oxides layers disposed on the same substrates. An etching solution including sulfuric acid and hydrofluoric acid may be used for these purposes. In some embodiments, the weight ratio of sulfuric acid to hydrofluoric acid in the etching solution is between about 15:1 and 100:1 (e.g., about 60:1). The temperature of the etching solution may be between about 30° C. and 50° C. (e.g., about 40° C. during etching). It has been found that such processing conditions provide a SiARC etching rate of at least about 50 nanometers per minute and selectivity of SiARC over silicon oxide of greater than about 10:1 or even greater than about 50:1. The same etching solution may be also used to remove photoresist, organic dielectric, and titanium nitride. However, amorphous carbon remains substantially intact.

In some embodiments, a method for processing semiconductor substrates involves providing a semiconductor substrate including a first structure and a second structure. The first structure may include a silicon containing antireflective coating. The second structure may include a silicon oxide layer. The method may proceed with exposing the semiconductor substrate to an etching solution. The etching solution includes sulfuric acid and hydrofluoric acid. The method proceeds with etching the first structure. During this etching operation, the second structure is exposed to the etching solution for at least a portion of time. The etching rate of the first structure is greater than the etching rate of the second structure.

In some embodiments, the silicon containing antireflective coating includes siloxane functional groups. The concentration of silicon in the silicon containing antireflective coating may be at least about 30 atomic %. The weight ratio of sulfuric acid to hydrofluoric acid in the etching solution is between about 15:1 and 100:1. The etching selectivity of the first structure to the second structure may be greater than about 10:1. In some embodiments, the etching solution is held at a temperature of between about 30° C. and 50° C. during etching of the first structure.

In some embodiments, the semiconductor substrate also includes a third structure. The third structure includes one of photoresist, organic dielectric, or titanium nitride. At least part of the third structure is etched away by the etching solution. In some embodiments, the semiconductor substrate also includes a fourth structure. The fourth structure includes one of an amorphous carbon layer or hafnium oxide. During etching of the first structure, the fourth structure is exposed to the etching solution for at least a portion of time. The fourth structure remains substantially intact after etching the first structure.

In some embodiments, the etching rate of the first structure is between about 10 nanometers per minute and 500 nanometers per minute or, more specifically, between about 50 nanometers per minute and 200 nanometers per minute. The etching rate of the second structure may be less than about 2 nanometers per minute or, more specifically, less than 1 nanometer per minute.

In some embodiments, the method also involves exposing the semiconductor substrate to a pretreatment solution, prior to exposing the semiconductor substrate to the etching solution. The etching solution may have a pH of less than about 0. In some embodiments, the etching solution also includes water. The concentration of water in the etching solution may be less than about 15% by weight or, more specifically, less than about 10% by weight. In some embodiments, the etching solution also includes hydrochloric acid. The method is a part of a photolithography rework. The silicon oxide layer may be a thermal oxide.

Also provided is a method for processing semiconductor substrates. The method includes providing a semiconductor substrate including a first structure and a second structure. The first structure includes a silicon containing antireflective coating. The silicon containing antireflective coating has siloxane groups and has a concentration of silicon of at least about 30 atomic %. The second structure includes a silicon oxide layer. The method proceeds with exposing the semiconductor substrate to an etching solution. The etching solution includes sulfuric acid and hydrofluoric acid. The weight ratio of the sulfuric acid and hydrofluoric acid in the etching solution may be between about 15:1 and about 100:1. The method may proceed with etching the first structure. During etching of the first structure, the second structure is exposed to the etching solution for at least a portion of time. The etching selectivity of the second structure to the first structure may be greater than about 10:1. The etching solution may be held at a temperature of between about 30° C. and 50° C. during etching.

These and other embodiments are described further below with reference to the figures.

DETAILED DESCRIPTION OF EXAMPLE EMBODIMENTS

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Introduction

The desire for high density integrated circuits is driving an increasing demand for smaller semiconductor devices and methods of fabricating such devices. The photolithography used to pattern semiconductor substrates has moved to light sources with shorter wavelengths (e.g., to 248 nm KrF excimer lasers and even to 193 nm ArF excimer lasers). Use of these shorter wavelengths is more likely to cause the interference of incident light with reflected light from a substrate, which may cause serious problems such as a standing wave effect caused by interference between incident light toward the photoresist layer and reflected light from the layer to be etched and disposed underneath the photoresist layer. Furthermore, halation can occur due to collection or scattering of light caused by irregularities on the surface of the substrate. These negative effects of photolithographic exposure can be suppressed to a certain extent by incorporating light absorbers into the photoresist and/or introducing ARCs between the photoresist and the layers underneath the photoresist (e.g., a silicon oxide layer). SiARCs are particularly promising materials for these application.

Photoresists and ARCs need to be removed after completing photolithography operations or when a semiconductor substrate needs to be reworked. For example, defects may be found in the photoresist before or after its exposure. During a rework process, a photoresist and an ARC are removed and replaced with a new photoresist and a new ARC without causing damage to other layers present on the substrate. During a regular process flow that does not involve a rework, the photoresist and the ARC are removed after completing pattern etching of the layers disposed under the photoresist and the ARC.

Wet etching could be a desirable method for removing photoresists and ARCs due to its cost, speed, and other factors. However, conventional wet etching solutions and process conditions are generally not effective to remove ARCs or, more specifically, SiARCs, and can be damaging to surrounding structures, such as silicon oxide. SiARCs may include siloxane groups that are similar to the groups present in silicon oxides. As such, chemicals that are effective at removing SiARCs (e.g., hydrofluoric acid) are typically damaging to silicon oxide structures. The damaging effects can be inhibited to a certain extent by diluting these chemicals and/or lowering the processing temperatures. However, these measures typically reduce the etching rates of SiARCs to levels that are not useful.

One way to characterize the effectiveness of an etching process, in which one structure needs to be preserved while another structure needs to be removed, is by specifying an etching selectivity. For purposes of this document, the etching selectivity is defined as a ratio of an etching rate of one material to an etching rate of another material. Returning to the example of a substrate including a SiARC and a silicon oxide layer, the etching selectivity of SiARC: silicon oxide should be greater than one in order to preserve the silicon oxide layer while removing the SiARC. Etching solutions and process conditions described yield high etching selectivities. In some embodiments, selectivity is greater than about 10:1 or even greater than about 50:1. As such, the SiARC may be removed without damaging the silicon oxide layer when these etching solutions and process conditions are used. It should be noted that a number of similar solutions and process conditions have been tested without much success as further explained in the experimental section.

Substrates exposed to etching solutions at given processing conditions may include layers and structures other than the SiARCs and silicon oxide layers, such as a photoresist layer, an amorphous carbon layer, an organic dielectric layer (ODL), a titanium nitride layer, and the like. It may be desirable to remove some of these layers together with the SiARCs (e.g., during the same etching operation or, more specifically, when a substrate is exposed to the same etching solution, while preserving other layers). In some embodiments, an etching solution configured to remove a SiARC may be also used to remove photoresist, organic dielectric, and/or titanium nitride, while other layers, such as amorphous carbon, may remain substantially intact when exposed to this etching solution. For purposes of this document, "substantially intact" is defined as retaining at least about 90% of the original thickness during etching operation.

Semiconductor Device Examples

Figure 1:
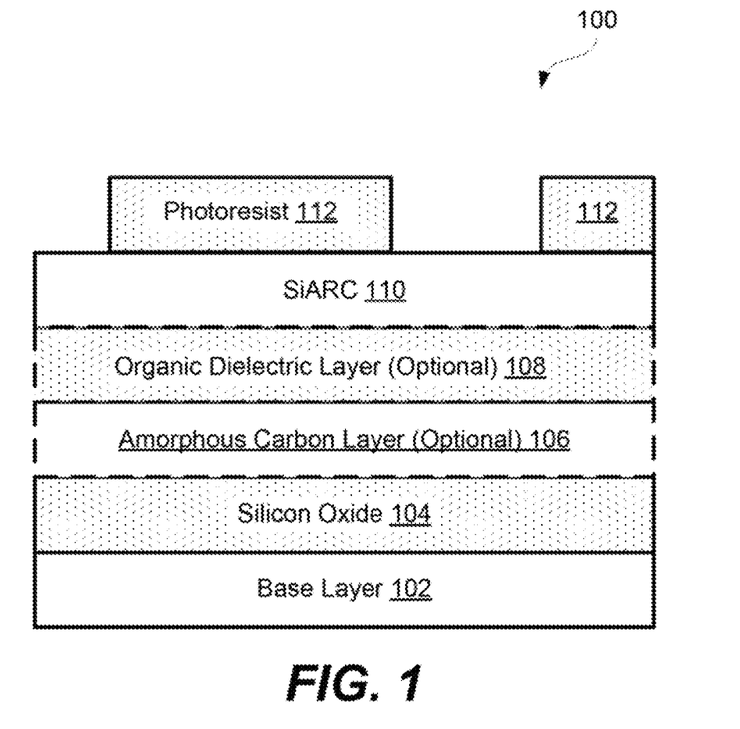
FIG. 1 is a schematic representation of a semiconductor substrate having a SiARC and other layers prior to etching of the SiARC, in accordance with some embodiments.

A brief description of semiconductor substrates and various coating, layers, and structures of these substrates is presented below to provide a better understanding of a method for processing the substrates or, more specifically, methods for etching at least SiARCs from the substrates while preserving at least silicon oxide layers. FIG. 1 is a schematic representation of a semiconductor substrate 100 having a SiARC 110 and other layers prior to etching of substrate 100, in accordance with some embodiments. Substrate 100 may include a base layer 102, which may be a wafer or some other kind of a supporting structure. Substrate 100 may also include a silicon oxide layer 104. In some embodiments, silicon oxide layer 104 is a thermal oxide. The thermal oxide may be formed, for example, by oxidizing silicon in base layer 102 at a high temperature (e.g., 800° C.-1200° C.). Silicon oxide layer 104 needs to be preserved when other layers of substrate 100, such as SiARC layer 110, are etched away. The thickness of silicon oxide layer 104 depends on the oxidation temperature, duration, and oxidizing agent and may be between about 250 nm and 1,000 nm, in some embodiments.

In some embodiments, substrate 100 may include an optional amorphous carbon layer 106. When amorphous carbon layer 106 is present, it needs to be preserved when other layers of substrate 100, such as SiARC layer 110, are etched away. The amorphous carbon may be used as an etch stop. Other materials may be used for this layer, such as amorphous fluorinated carbon ($\alpha$-FC) film.

Amorphous carbon layer 106 may be formed from a gas mixture of a hydrocarbon compound (e.g., propylene, propyne, propane, butane, butylene, butadiene, or acetylene) and an inert gas such as argon (Ar) or helium (He). The following deposition process parameters can be used to form the amorphous carbon layer 106. The process parameters include a substrate temperature of between about 100° C. and 500° C., a chamber pressure of between about 1 Torr and 20 Torr, a hydrocarbon gas flow rate of about 50 sccm to about 500 sccm (per 200 millimeter wafer), a radio frequency (RF) power of between about 0.4 W/cm$^2$ to about 3.2 W/cm$^2$ and a plate spacing of between about 7 millimeters to about 8 millimeters. The above process parameters provide a typical deposition rate for the amorphous carbon layer 106 in the range of about 10 nanometers/min to about 100 nanometers/min and can be implemented in a Plasma Enhanced Chemical Vapor Deposition (PECVD) chamber available, for example, from Applied Materials, Inc. in San Jose, Calif. The as-deposited amorphous carbon layer 106 has an adjustable carbon to hydrogen ratio that ranges from about 10% hydrogen to about 60% hydrogen. Controlling the hydrogen ratio of the amorphous carbon layer is desirable for tuning its optical properties as well as its etch selectivity. Specifically, as the hydrogen ratio decreases, the etch resistance of the amorphous carbon layer 106 increases.

In some embodiments, substrate 100 may include an optional ODL 108. When ODL 108 is present, it may need to be removed together with SiARC 110. ODL 108 may function as a planarization layer to fill trenches and other protrusions and make a flat top layer. ODL 108 may be referred to as an organic planarization layer (OPL). The OPL may be formed from a photo-sensitive organic polymer or an etchable type organic compound. Some examples include polyacrylate resin, epoxy resin, phenol resin, polyamide resin, polyimide resin, unsaturated polyester resin, polyphenylenether resin, polyphenylenesulfide resin, or benzocyclobutene (BCB). A few specific commercially available examples include CHM701B, available from Cheil Chemical Co., Ltd. in South Korea, HM8006 and HM8014, available from JSR Corporation in Japan, and ODL-102, available from ShinEtsu Chemical, Co., Ltd. in Japan. These materials may be deposited using spin-on techniques. Various organic materials listed above may form cross-linked structures while being cured.

As noted above, substrate 100 also includes a SiARC 110. SiARC 110 may be deposited over ODL 108 and/or amorphous carbon layer 106, if one or more of these layers are used. Alternatively, SiARC 110 may be deposited over silicon oxide layer 104. In some embodiments, the concentration of silicon in the SiARC may be at least about 30 atomic % and even at least about 40 atomic %. For example, the SiARC may be formed from commercially available materials, such as SHB-N04 and SHB-A940 from Shin Etsu Chemical Co., Ltd. In Japan. SiARC 110 may include siloxane (Si—O—Si) groups.

SiARC 110 may be applied using spin coating or vapor deposition. Once deposited, SiARC 110 may be baked to remove any solvent from the structure and cause the polymer of SiARC 110 to crosslink. The bake temperature may be between about 100° C. and 250° C. or, more specifically, between about 150° C. and 200° C. The thickness of SiARC 110 may be between about 20 nm and 150 nm or, more specifically, between about 25 nm and 80 nm.

In some embodiments, substrate 100 includes a photoresist layer 112. Some examples of photoresist layer 112 include a 248 nm photoresist, a 193 nm photoresist, a 157 nm photoresist, a EUV (extreme ultraviolet) photoresist, or an electron beam sensitive resist. Both positive-tone resists and negative-tone resists may be used. Photoresist layer 112 may be formed by any standard deposition techniques, such as spin coating. Photoresist layer 112 may be baked to remove any solvent from the layer and other purposes. The baking temperature may be between about 70° C. and 150° C. or, more specifically, between about 90° C. and 130° C. Photoresist layer 112 may have a thickness of between about 20 nm and 400 nm or, more preferably, between about 50 nm and 300 nm.

A resist pattern may be then formed in photoresist layer 112. The resist pattern may be formed by exposing photoresist layer 112 to radiation at an imaging wavelength. The radiation employed herein may be visible light, ultraviolet (UV), EUV, and electron beam (E-beam). For example, the imaging wavelength of the radiation may be about 365 nm, 248 nm, 193 nm, or 13 nm.

After exposure, photoresist layer 112 is developed in an aqueous base solution to form a resist pattern in photoresist layer 112. For example, an aqueous base solution, such as a tetramethylammonium hydroxide (TMAH) solution in water, may be used for these purposes. A post exposure bake may be performed after photoresist layer 112 is exposed to the radiation and before it is developed. The temperature range for this operation may be between about 70° C. and 120° C. or, more specifically, between about 90° C. and 110° C. An example of a patterned photoresist resist layer is shown in FIG. 1 as element 112.

After formation of the photoresist pattern, an after-development-inspection (ADI) system may be used to examine the pattern to determine if the pattern has been correctly manufactured. The ADI can determine a critical dimension and alignment or the presence of any residue or debris. The ADI may, for example, be a scanning electron microscope (SEM) or a light scattering system such as an optical digital profilometry (ODP) system. The ODP system may include a scatterometer incorporating beam profile ellipsometry and beam profile reflectometry (reflectometer). If a feature dimension of the photoresist pattern is not within tolerance specification or if a residue/defect is detected, the photoresist pattern must be reworked before etching features in substrate 100. According to some embodiments, the rework includes not only removing photoresist layer 112 from substrate 100 but also removing SiARC 110 and possibly other layers.

In some embodiments, photoresist layer 112 may be removed prior to removal of SiARC 110. In other words, photoresist layer 112 and SiARC 110 are removed in different operations and using different materials and/or techniques. For example, photoresist layer 112 may be removed from SiARC layer 110 using a conventional dry ashing process, a sulfuric acid hydrogen peroxide mixture (SPM) in a wet process, or a developer solution/photoresist solvent like propylene glycol mono-methyl ether acetate (PGMEA). In another example, photoresist layer 112 may be removed from SiARC layer 110 using a process gas containing ozone ($O_3$), followed by a wet spin-off process that centrifugally removes remains of photoresist layer 112 in the presence of de-ionized water (DIW) or an alkaline solution. Alternatively, photoresist layer 112 may be removed together with SiARC 110 in the same operation (i.e., operation 306 further described below with reference to FIG. 3).

Figure 2:
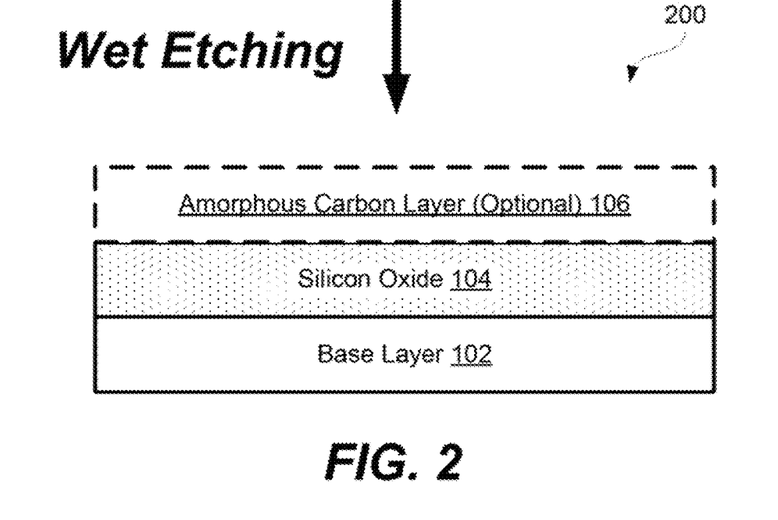
FIG. 2 is a schematic representation of the semiconductor substrate shown in FIG. 1 after etching of the SiARC and two other layers, in accordance with some embodiments.

FIG. 2 is a schematic representation of a semiconductor substrate 200 after removal of multiple layers, in accordance with some embodiments. Comparing semiconductor substrate 200 to semiconductor substrate 100 in FIG. 1, photoresist layer 112, SiARC 110, and ODL 108 were removed. At least one of these layers, SiARC 110, is removed by etching. In some embodiments, one or more other layers are also removed by etching. As shown in FIG. 2, amorphous carbon layer 106, if one is present, and silicon oxide layer 104 remain intact.

Processing Examples

Figure 3:
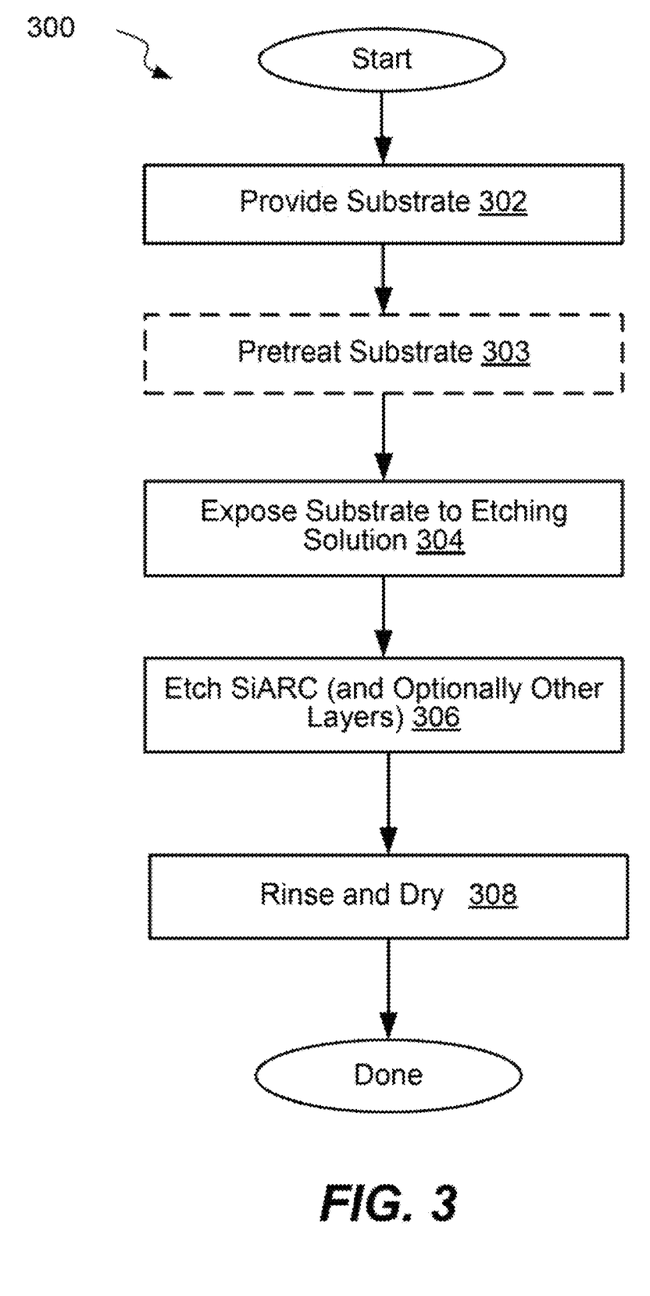
FIG. 3 is a process flowchart corresponding to a method for processing a semiconductor substrate that involves etching of a SiARC from the substrate, in accordance with some embodiments.

FIG. 3 is a process flowchart corresponding to a method 300 for processing semiconductor substrates including etching of SiARCs, in accordance with some embodiments. Method 300 may commence with providing a semiconductor substrate including at least a SiARC and a silicon oxide layer during operation 302. Other layers may be present as well on the substrate, such as an amorphous carbon layer, an ODL, and the like. Various examples of these layers are described above with reference to FIGS. 1 and 2.

In some embodiments, method 300 may proceed with pretreating the substrate during optional operation 303. This pretreatment operation may be performed prior to exposing the substrate to an etching solution during operation 304.

Method 300 may proceed with exposing the semiconductor substrate to an etching solution during operation 304. The etching solution includes sulfuric acid and hydrofluoric acid.

The weight ratio of the sulfuric acid to hydrofluoric acid in the etching solution may be between about 15:1 and about 100:1 or, more specifically, between about 50:1 and about 75:1, such as about 60:1.

As noted in the experimental results below, these ratios of sulfuric acid and hydrofluoric acid provided better selectivity between SiARC and silicon oxide. For example, lowering the concentration of sulfuric acid relative to hydrofluoric acid increases the etching rate of the SiARC. However, the etching rate of silicon oxides increases even faster, thereby causing the selectivity of SiARC-to-silicon oxide to decline. At the same time, increasing the concentration of sulfuric acid relative to hydrofluoric acid reduces the etching rate of SiARC faster than it reduces the etching rate of silicon oxides, which also causes the selectivity of SiARC-to-silicon oxide to decline. Furthermore, low etching rates of SiARC may increase production cost by prolonging the required process time.

Addition of sulfuric acid to hydrofluoric acid helps reduce the pH of the etching solution. In some embodiments, the pH of the etching solution is less than about 0, such as between about 0 and −1. It has been found that other acids, such as hydrochloric acid, do not provide desired performance when mixed with hydrofluoric acid even though similar pH levels can be reached. The deficiencies of other acids are illustrated in the experimental results section below. However, other acids, such as hydrochloric acid, may be used as an additive and mixed together with sulfuric acid and hydrofluoric acid. In some embodiments, the hydrochloric acid concentration does not exceed 50% of the hydrofluoric acid concentration.

Furthermore, sulfuric acid is available in more concentrated forms (e.g., up to 96% by weight) than some other acids, which allows formulation of etching solutions with a lower water content. In some embodiments, the etching solution has a concentration of water of less than about 15% by weight or, more specifically, less than about 10% by weight. Increasing the water content increases the silicon oxide etch rate, thus increasing the silicon oxide to SiARC selectivity.

The etching solution may be formulated using water solutions of sulfuric acid and hydrofluoric acid, such as a 96% by weight sulfuric acid solution and a 49% by weight hydrofluoric acid solution. In some embodiments, these solutions may be mixed using a volumetric ratio of between about 5:1 (i.e., 5 parts of the 96% by weight sulfuric acid solution for 1 part of the 49% by weight hydrofluoric acid solution) to between about 30 (i.e., 30 parts of the 96% by weight sulfuric acid solution for 1 part of the 49% by weight hydrofluoric acid solution).

When sulfuric acid and hydrofluoric acid are combined, the resulting etching solution may experience an increase in temperature. In some embodiments, method 300 may include an operation during which the etching solution is formulated and brought up to the desired temperature. In some embodiments, the etching solution is maintained at a temperature of between about 30° C. and 50° C. or, more specifically, at about 40° C. during etching. As noted in the experimental results below, other temperatures of the etching solution provide less-favorable selectivities or etch rates. For example, lowering the temperature to 25° C. reduces the etching rate of SiARC much more than it reduces the etching rate of silicon oxide, thereby causing the selectivity of SiARC-to-silicon oxide to decline. At the same time, increasing the temperature (e.g., to 60° C.) increases the etching rate of SiARC. However, the etching rate of silicon oxide grows even faster, which also causes the selectivity of SiARC-to-silicon oxide to decline.

Method 300 may proceed with etching the SiARC during operation 306. The silicon oxide structure is typically exposed to the etching solution for at least a portion of time during this operation (for example, as the SiARC is being removed). The etching rate of the SiARC is greater than an etching rate of the silicon oxide structure. In some embodiments, the etching selectivity of the SiARC to the silicon oxide is greater than about 10:1 or, more specifically, greater than about 20:1 and even greater than about 50:1. Such selectivity is achieved by using specific formulations and temperatures of the etching solution as described above and further in the experimental results section below.

In some embodiments, the etching rate of the SiARC is at least about 10 nanometers per minute, such as between about 10 nanometers per minute and 500 nanometers per minute. More specifically, the etching rate of the SiARC may be at least about 50 nanometers per minute, such as between about 50 nanometers per minute and 200 nanometers per minute. At the same time, the etching rate of the silicon oxide structure is less than 2 nanometers per minute or, more specifically, less than about 1 nanometer per minute.

In some embodiments, the semiconductor substrate may include another structure including a photoresist or titanium nitride. This structure is also etched away during etching of the SiARC. As such, operation 306 may involve etching away or two or more structures, one of which is a SiARC. In some embodiments, the semiconductor substrate may include an amorphous silicon structure and/or ODL structure. Even if these structures are exposed to the etching solution, they may remain substantially intact during operation 306.

Method 300 may proceed with may proceed with rinsing and drying the substrate during operation 308. The residual etching solution is removed from the substrate surface during this operation by, for example, rinsing the surface with deionized water and drying with an inert gas, such as nitrogen or argon.

In some embodiments, method 300 may be a part of a photolithography rework. For example, a photoresist layer may need to be removed and replaced together with a SiARC structure after unsuccessful exposure and/or deposition of the photoresist layer. Once the photoresist layer and the SiARC structure are removed, a new SiARC structure is deposited on the substrate followed by the deposition of the photoresist layer.

Experimental Results

Various experiments have been conducted to determine the effects of different processing conditions and etching solution compositions on selectivity and etching rates.

In one set of experiments, four different ratios of sulfuric acid and hydrofluoric acid were tested at three different temperatures. The first etching solution was a 10:1 by volume mixture of a 96% by weight sulfuric acid solution and a 49% by weight hydrofluoric acid (i.e., a 10:1 etching solution). The second etching solution was a 20:1 mixture of the same acid solutions (i.e., a 20:1 etching solution), the third etching solution was a 30 mixture of the same acid solutions (i.e., a 30:1 etching solution), and, finally, the fourth etching solution was a 40:1 mixture of the same acid solutions (i.e., a 40:1 etching solution). The temperatures used in this set of experiments were 25° C., 40° C., and 60° C. for each etching solution. Etching rates for SiARCs and silicon oxide layers were determined for samples immersed in each of these four solutions at each of the three temperatures. The etching solutions were quickly removed from the surface by rinsing to ensure controllable test conditions. Selectivity values were calculated from these etching rates. The results of this set of experiments are presented in the table below.

TABLE 1

| Volume Ratio H$_2$SO$_4$ (96% by weight):HF (49% by weight) | Temp, °C. | SiARC Etch Rate, Å/min | SiOx Etch Rate, Å/min | SiARC/SiOx Selectivity |
|---|---|---|---|---|
| 10:1 | 25 | 510.4 | 26.9 | 19.0:1 |
| 20:1 | 25 | 20.7 | 9.1 | 2.3:1 |
| 40:1 | 25 | 6.0 | 4.2 | 1.4:1 |
| 80:1 | 25 | 1.1 | −0.3 | N/A |
| 10:1 | 40 | 2145.3 | 51.4 | 41.8:1 |
| 20:1 | 40 | 698.0 | 9.8 | 71.5:1 |
| 40:1 | 40 | 84.5 | 3.3 | 26.0:1 |
| 80:1 | 40 | 8.2 | 0.3 | 25.7:1 |
| 10:1 | 60 | 2302.3 | 311.2 | 7.4:1 |
| 20:1 | 60 | 1236.8 | 59.4 | 20.8:1 |
| 40:1 | 60 | 76.6 | 18.4 | 4.2:1 |
| 80:1 | 60 | 28.7 | 8.3 | 3.5:1 |

As can be seen from these results, the etching rates for both SiARCs and silicon oxides layers drop sharply as hydrofluoric acid is diluted with sulfuric acid. Specifically, the etching rates of the 40:1 etching solution and the 80:1 etching solution are too slow for many commercial uses. Without being restricted to any particular theory, it is believed that hydrofluoric acid is the main etchant in the solution, while the purpose of sulfuric acid is to control pH level and selectivity of etching. However, sulfuric acid may be useful for removing other layers, such as an ODL and, in some embodiments, a photoresist layer.

It has also been found that changes in temperature have a significant effect on the etching selectivity. For example, the 20:1 etching solution at 40° C. had the highest SiARC/SiOx selectivity of 71.5:1. Both increasing the temperature and decreasing the temperature caused this selectivity to drop. Specifically, the same 20:1 etching solution at 25° C. had the SiARC/SiOx selectivity of 2.3:1, while at 60° C. this solution had the selectivity of 20.8:1.

In another set of experiments, a diluted hydrofluoric acid solution with no sulfuric acid was tested. The results of these experiments, expressed in the form of etching rates and etching selectivities, generally did not have the combination of high SiARC etch rate and high selectivity observed in the solutions that included sulfuric acid. An etching solution formed by combining 100 parts of water with 1 part of 49% by weight hydrofluoric acid (i.e., a 100:1 etching solution) yielded etching rates of less than 20 nanometers per minute for SiARC materials. At the same time, a less diluted solution was damaging to silicon oxide layers.

In another experimental set, pH levels of the 100:1 etching solution (i.e., 100 parts of water with 1 pat of 49% by weight hydrofluoric acid) were adjusted by adding hydrochloric acid. Lowering the pH levels helped to increase the SiARC etching rates, but the silicon oxide etching rates increased as well. The results of this test are presented in Table 2 below. The highest selectivity achieved by adding hydrochloric acid was only 3.5:1, which was significantly lower than the selectivity of 71.5:1 presented in Table 1 above.

TABLE 2

| pH of 100:1 etching solution | Temp, °C. | SiARC Etch Rate, Å/min | SiOx Etch Rate, Å/min | SiARC/SiOx Selectivity |
|---|---|---|---|---|
| no HCl added | 25 | 66.8 | 38.1 | 1.8:1 |
| pH = 1 | 25 | 58.2 | 28.7 | 2.0:1 |
| pH = 0 | 25 | 92.2 | 26.8 | 3.4:1 |
| pH = −1 | 25 | 213.4 | 114.5 | 1.9:1 |
| no HCl added | 40 | 114.6 | 64.3 | 1.8:1 |
| pH = 1 | 40 | 125.7 | 53.7 | 2.3:1 |
| pH = 0 | 40 | 170.6 | 48.3 | 3.5:1 |
| pH = −1 | 40 | 430.7 | 204.2 | 2.1:1 |
| no HCl added | 60 | 297.0 | 119.9 | 2.5:1 |
| pH = 1 | 60 | 290.5 | 111.5 | 2.6:1 |
| pH = 0 | 60 | 330.2 | 98.0 | 3.4:1 |
| pH = −1 | 60 | 860.7 | 399.7 | 2.2:1 |

Another set of experiments was performed to determine the impact of etching solutions on organic dielectric layers. These layers generally need to be removed during rework of the photoresist and other like processes. The organic dielectric layers remained relatively intact after being exposed to a diluted hydrofluoric acid solution that contained no sulfuric acid. However, when hydrofluoric acid was combined with sulfuric acid, rather fast etching of organic dielectric layers was observed. The etching rates of the organic dielectric layers were much higher when immersed in a 20:1 by volume mixture of a 96% by weight sulfuric acid solution and a 49% by weight hydrofluoric acid (i.e., a 20:1 etching solution) than with a 10:1 by volume mixture of a 96% by weight sulfuric acid solution and a 49% by weight hydrofluoric acid (i.e., a 10:1 etching solution).

Yet another set of experiments was conducted in which SiARCs were formed over amorphous carbon layers and then the SiARCs were removed. Five different etching solutions (combinations of sulfuric acid and hydrofluoric acid as well as diluted hydrofluoric acid solutions) at three different temperatures (i.e., 25° C., 40° C., and 60° C.) were tested. Ellipsometry measurements showed no amorphous carbon loss with any of the etching solutions or temperatures. As deposited (before depositing SiARCs), the amorphous carbon layers had contact angles of about 60°-65° (water droplet test). The contact angle changes illustrate modification to the surface of the amorphous carbon film. The surface energy was changed during the exposure resulting in the initial angle decrease. The surface energy then returned to the original value with time. Without being restricted to any particular theory, it is believed that some trace surface organics were first removed and re-grew/re-deposited with atmospheric exposure.

Removal of the SiARC with the diluted hydrofluoric acid solutions yielded amorphous carbon layers that had lower contact angles (i.e., about 35°-40°). When the SiARCs were removed with the combinations of sulfuric acid and hydrofluoric acid, the resulting contact angles were even lower (i.e., about 27°-35°). When surfaces of the amorphous carbon layers were retested 20 days later, all contact angles were in the 55°-60° range.

Apparatus Examples

Figure 4:
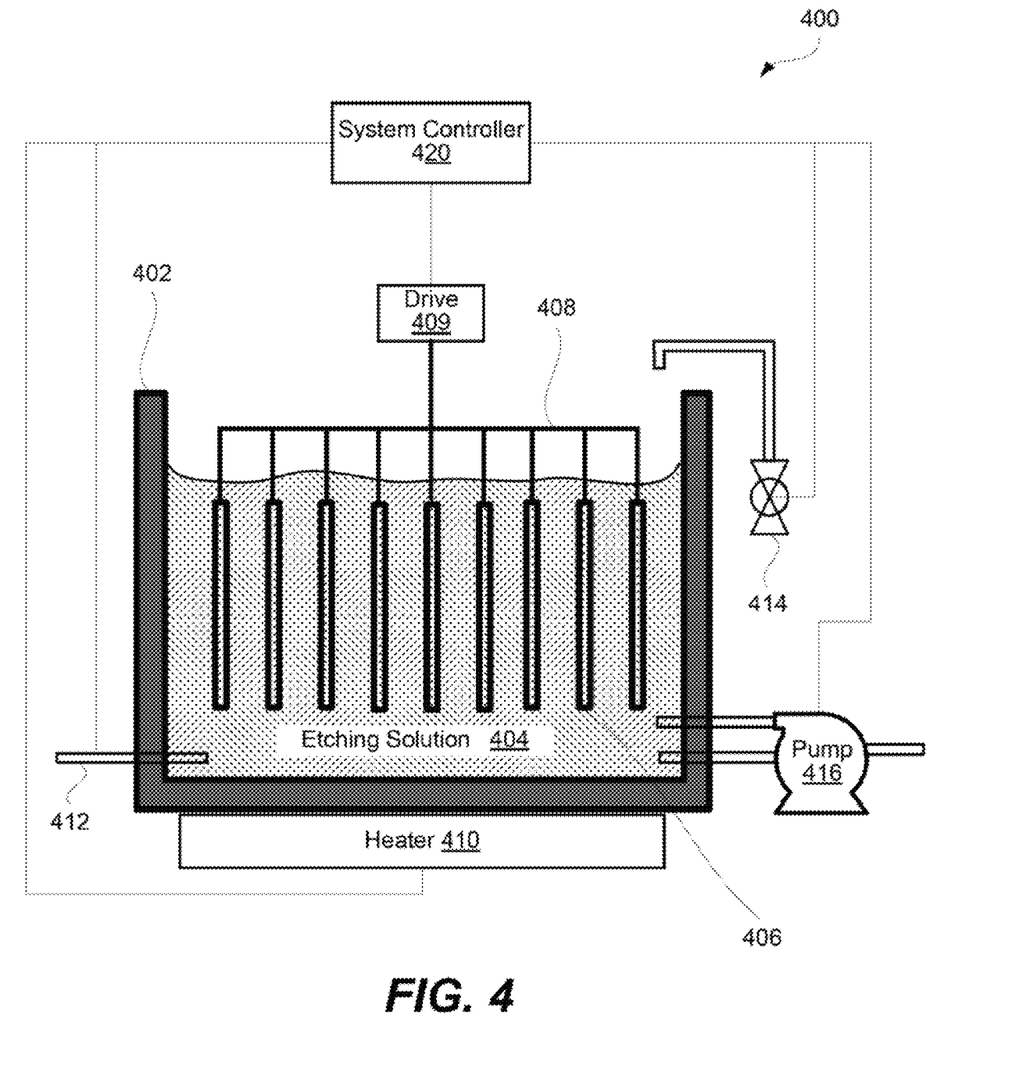
FIG. 4 illustrates a schematic representation of an etching apparatus for processing a semiconductor substrate to remove a SiARC using an etching solution, in accordance with some embodiments.

FIG. 4 illustrates a schematic representation of etching apparatus 400 for processing a semiconductor substrate to etch SiARCs, in accordance with some embodiments. For clarity, some components of apparatus 400 are not included in this figure. Apparatus 400 includes bath 402 for containing etching solution 404. One or more semiconductor substrates 406 may be immersed in etching solution 404 for processing or, more specifically, for removal of silicon nitride structures. Substrate 406 may be supported by substrate holder 408, which may be attached to drive 409 for moving substrate holder 408. Specifically, substrate holder 408 may be moved to immerse substrates 406 into etching solution 404 for processing, remove substrates 406 from etching solution 404 after processing, and/or to move substrates 406 within etching solution 404 during processing (e.g., to agitate etching solution 404).

Apparatus 400 also includes heater 410 and temperature sensor 412 (e.g., a thermocouple) for maintaining etching solution 404 at a predetermined temperature. Heater 410 and temperature sensor 412 may be connected to system controller 420, which may control power supplied to heater 410 based on signals received from temperature sensor 412. Various features of system controller 420 are described below.

Apparatus 400 may also include a liquid delivery system 414 for supplying additional liquids and controlling the composition of etching solution 404. For example, some components of etching solution 404 may evaporate from bath 402, and these components may be replenished in bath 402 by liquid delivery system 414. Liquid delivery system 414 may be connected to and controlled by system controller 420. Various other sensors (e.g., conductivity sensor, weight sensor) may be used to provide signals about potential changes in composition of etching solution 404. Apparatus 400 may be also equipped with pump 416 for recirculating etching solution 404 in bath 402 and other purposes. Pump 416 may be also connected to and controlled by system controller 420.

Apparatus 400 may include system controller 420 for controlling process conditions. Controller 420 may include one or more memory devices and one or more processors with a central processing unit (CPU) or computer, analog and/or digital input/output connections, stepper motor controller boards, and the like. In some embodiments, controller 420 executes system control software including sets of instructions for controlling timing of operations, temperature of etching solution 404, composition of etching solution 404, and other parameters. Other computer programs and instruction stored on memory devices associated with controller may be employed in some embodiments.

CONCLUSION

Although the foregoing concepts have been described in some detail for purposes of clarity of understanding, it will be apparent that some changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A method for processing semiconductor substrates, the method comprising:
    providing a semiconductor substrate comprising a first structure, a second structure, and a third structure,
        the first structure comprising a silicon containing antireflective coating,
        the silicon containing antireflective coating comprising siloxane functional groups,
        the second structure comprising a silicon oxide layer;
        the third structure comprising an organic dielectric layer;
    exposing the semiconductor substrate to an etching solution,
        the etching solution comprising sulfuric acid and hydrofluoric acid; and
    etching the first structure,
        wherein a weight ratio of sulfuric acid to hydrofluoric acid in the etching solution is between about 15:1 and about 100:1;
        wherein, during etching the first structure, the second structure is exposed to the etching solution for at least a portion of time;
        wherein an etching selectivity ratio of the second structure to the first structure is less than about 0.1; and
        wherein at least part of the third structure is etched away by the etching solution.

2. The method of claim 1, wherein a concentration of silicon in the silicon containing antireflective coating is at least about 30%.

3. The method of claim 1, wherein the etching solution is held at a temperature of between about 30° C. and 50° C. during etching of the first structure.

4. The method of claim 1, wherein, prior to exposing the semiconductor substrate to the etching solution, the semiconductor substrate further comprises a fourth structure,
    the fourth structure comprising one of an amorphous carbon layer or hafnium oxide;
    wherein, during etching of the first structure, the fourth structure is exposed to the etching solution for at least a portion of time; and
    wherein the fourth structure remains substantially intact after etching the first structure.

5. The method of claim 1, wherein an etching rate of the first structure is between about 10 nanometers per minute and 500 nanometers per minute.

6. The method of claim 1, wherein an etching rate of the first structure is between about 50 nanometers per minute and 200 nanometers per minute.

7. The method of claim 1, wherein an etching rate of the second structure is less than about 2 nanometers per minute.

8. The method of claim 1, wherein an etching rate of the second structure is less than about 1 nanometer per minute.

9. The method of claim 1, further comprising, prior to exposing the semiconductor substrate to the etching solution, exposing the semiconductor substrate to a pretreatment solution.

10. The method of claim 1, wherein the etching solution has a pH of less than about 0.

11. The method of claim 1, wherein the etching solution further comprises water, and wherein a concentration of water in the etching solution is less than about 15% by weight.

12. The method of claim 1, wherein the etching solution further comprises water, and wherein a concentration of water in the etching solution is less than about 10% by weight.

13. The method of claim 1, wherein the etching solution further comprises hydrochloric acid.

14. The method of claim 1, wherein the method is a part of a photolithography rework.

15. The method of claim 1, wherein the silicon oxide layer is a thermal oxide.

16. The method of claim 1, wherein, prior to exposing the semiconductor substrate to the etching solution, the semiconductor substrate further comprises a fourth structure,
    the fourth structure comprising one of an amorphous carbon layer;
    wherein, during etching of the first structure, the fourth structure is exposed to the etching solution for at least a portion of time; and
    wherein the fourth structure remains substantially intact after etching the first structure.

17. The method of claim 16, wherein the third structure and the fourth structure is disposed between the first structure and the second structure.

* * * * *